United States Patent
Kozlowski et al.

(10) Patent No.: US 6,531,426 B1
(45) Date of Patent: Mar. 11, 2003

(54) NEODYMIUM GALLATE SURFACE BARRIER FOR MELT-PROCESSED $YBA_2CU_3O_X$ CONDUCTOR WITH NICKEL SHEATH

(75) Inventors: Gregory Kozlowski, Centerville, OH (US); Charles E. Oberly, Urbana, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 1472 days.

(21) Appl. No.: 08/927,106

(22) Filed: Aug. 28, 1997

Related U.S. Application Data

(63) Continuation-in-part of application No. 08/469,160, filed on Jun. 6, 1995, now abandoned, which is a division of application No. 08/278,626, filed on Jul. 18, 1994, now abandoned, which is a continuation-in-part of application No. 08/085,891, filed on Jul. 6, 1993, now abandoned.

(51) Int. Cl.$^7$ .......................... H01B 12/00; H01L 39/24

(52) U.S. Cl. .................. 505/230; 505/238; 505/239; 505/704; 174/125.1; 29/599

(58) Field of Search ................. 505/230, 239, 505/238, 704; 427/62, 63; 174/125.1; 29/599

(56) References Cited

U.S. PATENT DOCUMENTS

| | | | |
|---|---|---|---|
| 4,994,435 A | 2/1991 | Shiga et al. ............. 505/1 |
| 5,024,894 A | * 6/1991 | Chien ................. 428/433 |
| 5,047,389 A | 9/1991 | Woolf et al. ............ 505/1 |
| 5,118,663 A | 6/1992 | Woolf et al. ............ 505/1 |
| 5,140,006 A | 8/1992 | Woolf ................. 505/1 |
| 5,164,360 A | 11/1992 | Woolf et al. ............ 505/1 |

FOREIGN PATENT DOCUMENTS

JP 04-152319 5/1992

OTHER PUBLICATIONS

Han et al., Metalorganic Chemical Vapor Deposition Route to Epitaxial Neodymium Gallate Thin Films, Applied Physics Letters, vol. 61, No. 25, Dec. 92, pp. 3047–3049.

Boikov et al., Epitaxial Growth and Properties of $YBa_2Cu_3O_{7-\delta}/NdGaO_3/YBa_2Cu_3O_{7-\delta}$ Trilayer Structures, Applied Physics Letters, vol. 59, No. 20, Nov. 91, pp. 2606–2608.

Mukaida et al., Preparation of $YBa_2Cu_3O_{7-\delta}$ High $T_c$ Thin Films on $NdGaO_3$ Substrate by Laser Ablation, Japanese Journal of Applied Physics, vol. 29, No. 6, Jun. 1990, pp. L936–L939.

(List continued on next page.)

Primary Examiner—Brian K. Talbot
(74) Attorney, Agent, or Firm—Fredric L. Sinder; Thomas L. Kundert

(57) ABSTRACT

A new process for making a neodymium gallate (NGO) surface layer on the inside surface of a protective outer sheath of nickel surrounding a core of yttrium-based copper oxide (YBCO) superconductor material permits manufacture of very high performance superconducting wire and tape. The NGO surface layer acts as a diffusion barrier to prevent diffusion of nickel into the YBCO during high temperature melt-processing. The NGO is applied, preferably by slurry casting, to a flat strip of solid nickel and then sintered at temperatures above about 1000° C. The sintering binds the NGO to the nickel strip and fixes it so that it will not react chemically with the YBCO during later melt-processing. The nickel strip and NGO diffusion barrier layer are next rolled into a trough and YBCO ceramic powder inserted inside the trough. The trough is then further rolled into a tube leaving an open seam for oxygen to penetrate during the oxygen anneal procedure of melt-processing. Finally, the tube sheath acts as a crucible for melt-processing of the YBCO to complete the manufacture of a high performance superconducting wire.

8 Claims, 2 Drawing Sheets

OTHER PUBLICATIONS

Ozaki et al., Preparation of Superconducting Y–BA–CU–O Thin Films on Metallic Substrates, Science and Technology of Thin Film Superconductors, ED. McConnell, 1989, pp. 363–370.

Konaka et al., Preparation of Y–BA–CU–O Superconducting Tape by Atmospheric Plasma Spraying, Japanese Journal of Applied Physics, vol. 27, No. 6, Jun. 1988, pp. L1092–L10093.

* cited by examiner

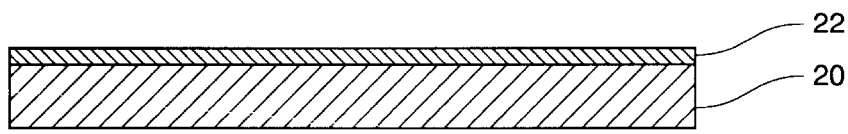
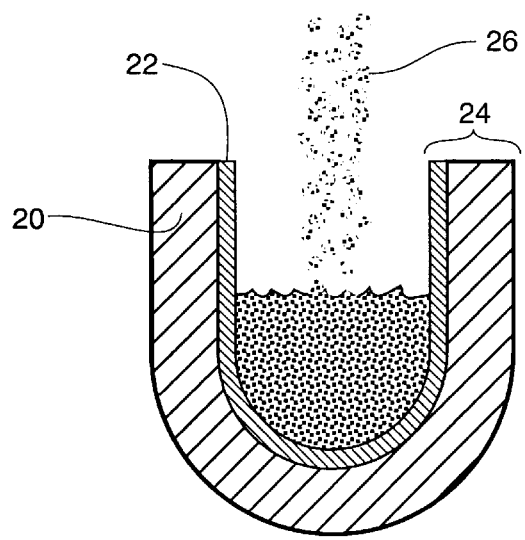
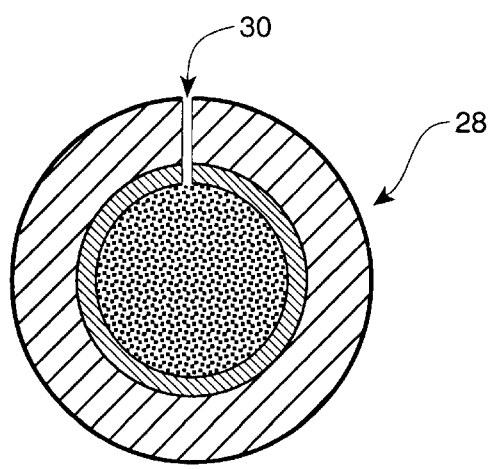

NEODYMIUM GALLATE SURFACE BARRIER FOR MELT-PROCESSED YBA$_2$CU$_3$O$_X$ CONDUCTOR WITH NICKEL SHEATH

CROSS-REFERENCE TO RELATED APPLICATIONS

This application is a continuation-in-part of application Ser. No. 08/469,160, filed Jun. 6, 1995, now abandoned, which was a division of application Ser. No. 08/278,626, filed Jul. 18, 1994, now abandoned, which was a continuation-in-part of application Ser. No. 08/085,891, filed Jul. 6, 1993, now abandoned.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to superconducting wire and tape, and more particularly to a process for making a neodymium gallate (NGO) surface layer on the inside surface of a protective outer sheath of nickel surrounding a core of yttrium-based copper oxide (YBCO) superconductor material. The NGO surface layer acts as a diffusion barrier to prevent diffusion of nickel into the YBCO during high temperature melt-processing.

High temperature superconductors are typically copper oxide ceramics which have little mechanical strength. They must be sheathed by compatible metals such as silver or silver alloys in order to be mechanically sound and to provide thermal stability and quench protection. Some bismuth-based copper oxide ceramic superconductors work well with silver or silver alloy sheaths because grain growth and necessary texturing can be conducted by mechanical means with subsequent sintering at relatively low temperatures around 85° C. to create a valuable superconducting wire or tape for winding magnets. Work along these lines has been successfully pursued by the inventors and others worldwide. Cylindrically sheathed conductors, or superconducting wires, have been produced with critical current densities in magnetic fields of 6×10$^4$ A/cm$^2$ at 20° Kelvin. Unfortunately, these bismuth-based copper oxide superconductors do not perform well at high temperatures (>30° K) and high magnetic fields because they lack good magnetic flux pinning.

On the other hand, YBCO superconductors can perform well at high temperatures. However, YBCO superconductors do not develop the prerequisite grain growth and texturing necessary for good current density unless they undergo a melt process in the vicinity of 1050° C. Consequently, a sheath encasing YBCO must also withstand this high melt temperature without interacting with the YBCO. Silver and a few silver alloys are the only metals which can be directly applied as a sheath to YBCO without poisoning superconductor performance. Unfortunately, these metals tend to melt at temperatures near 1100° C. There is a need, therefore, for metal sheaths or cladding which can survive the high temperatures of YBCO melt-processing. Nickel and nickel-based alloys have been tested by the inventors and found to be good sheath candidates. Some nickel-sheathed YBCO conductors fabricated and tested by the inventors have carried 1400 amperes, a world record. The problem with a nickel sheath is that nickel diffuses into the YBCO during the very hot melt process and replaces copper in the YBCO. When the nickel for copper exchange occurs, the critical temperature of the YBCO is significantly depressed so that the critical current density begins to disappear above 40° K, even though excellent magnetic flux pinning has been introduced into the YBCO by a variety of different methods. Despite its promise, this level of superconductor performance has thus far been no better than other approaches above 40° K.

Thus it is seen that there is a need for a method for preventing nickel diffusion from a nickel sheath into YBCO during melt-processing and at other times.

It is, therefore, a principal object of the present invention to provide a nickel diffusion barrier for a nickel sheath to enhance YBCO superconductor performance.

It is another object of the present invention to provide a nickel diffusion barrier for a nickel sheath for any ceramic superconductor material.

It is a feature of the present invention that it can be used to provide a nickel diffusion barrier for any nickel substrate, such as a tube, a flat tape, a wire, a plate or other shapes.

It is another feature of the present invention that it permits forming of superconducting wires or tapes with very high critical current densities.

It is an advantage of the present invention that it makes possible the manufacture of YBCO superconductor wire.

It is another advantage of the present invention that simplifies the process of making superconductor wire by allowing the nickel sheath to act as a crucible for the demanding and necessary melt-processing of YBCO.

These and other objects, features and advantages of the present invention will become apparent as the description of certain representative embodiments proceeds.

SUMMARY OF THE INVENTION

The present invention provides a neodymium gallate surface layer on a nickel sheath as a diffusion barrier to prevent diffusion of nickel into YBCO during high temperature melt-processing of the YBCO. The unique discovery of the present invention is that a neodymium gallate (NGO) surface layer on a nickel sheath will prevent nickel diffusion during melt-processing of the YBCO. The key step is presintering a surface layer of NGO powder applied over the nickel sheath at temperatures sufficient for nickel from the nickel sheath to diffuse into the NGO.

Accordingly, the present invention is directed to a ceramic superconductor comprising a nickel substrate, a yttrium-based copper oxide superconductor and, between the nickel substrate and the yttrium-based copper oxide superconductor, a diffusion barrier made of neodymium gallate, wherein the neodymium gallate has been presintered at temperatures above about 1000° C. The presintering may be performed at temperatures in the range of about 1000° C. to about 1300° C. The nickel substrate may be a tube, a flat tape, a wire or a plate.

The present invention is also directed to a method for making a substrate for a ceramic superconductor, comprising the steps of providing a nickel substrate, applying a layer of neodymium gallate over the nickel substrate as a diffusion barrier and sintering the layer of neodymium gallate at temperatures above about 1000° C. The layer of neodymium gallate may be sintered at temperatures in the range of about 1000° C. to about 1300° C. The nickel substrate may be a tube, a flat tape, a wire, or a plate.

The present invention is additionally directed to a method for making a ceramic superconductor, comprising the steps of providing a nickel substrate, applying a layer of neodymium gallate over the nickel substrate, sintering the layer of neodymium gallate at temperatures above about 1000° C., and applying a layer of yttrium-based copper oxide over the layer of sintered neodymium gallate. The layer of neodymium gallate may be sintered at temperatures in the range of about 1000° C. to about 1300° C. The nickel substrate may be a tube, a flat tape, a wire or a plate.

DESCRIPTION OF THE DRAWINGS

The present invention will be more clearly understood from reading of the following detailed description in conjunction with the accompanying drawings wherein:

FIG. 3 is a cross section of a flat strip of solid metal with a diffusion barrier layer of NGO before sintering and roll-forming according to the present invention;

FIG. 4 is a cross section of a partially roll-formed superconductor sheath showing insertion of the YBCO powder; and, FIG. 5 is a cross section of a completely roll-formed powder in tube with diffusion barrier geometry for a superconducting wire according to the present invention.

DETAILED DESCRIPTION

Figure 1:
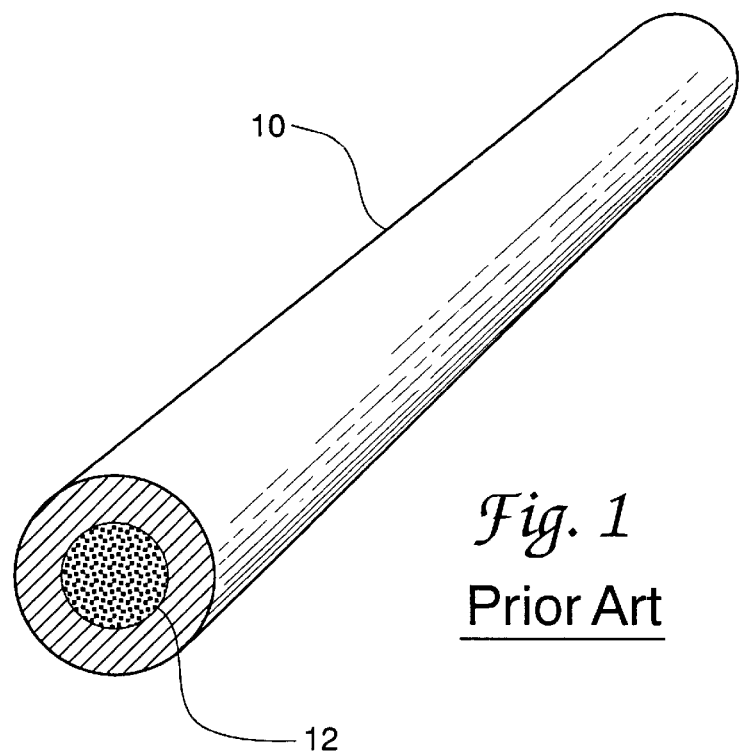
FIG. 1 is a perspective view of a prior art powder inside a tube (PIT) geometry for a superconducting wire.

Referring now to FIG. 1 of the drawings, there is shown a perspective view of a prior art powder inside a tube (PIT) geometry for superconducting wire. A solid metal sheath 10 surrounds a core 12 of superconductor powder. Typical sheath materials such as silver and silver alloys, which have the significant property of not poisoning superconductor performance, unfortunately cannot withstand the high temperatures (about 1050° C.) required for melt-processing a core of a yttrium-based copper oxide (YBCO) superconductor. A nickel sheath can withstand the high temperatures, and also desirably provide high mechanical strength for the resulting wire, but nickel diffusion into the YBCO during melt-processing lowers its critical temperature.

Figure 2:
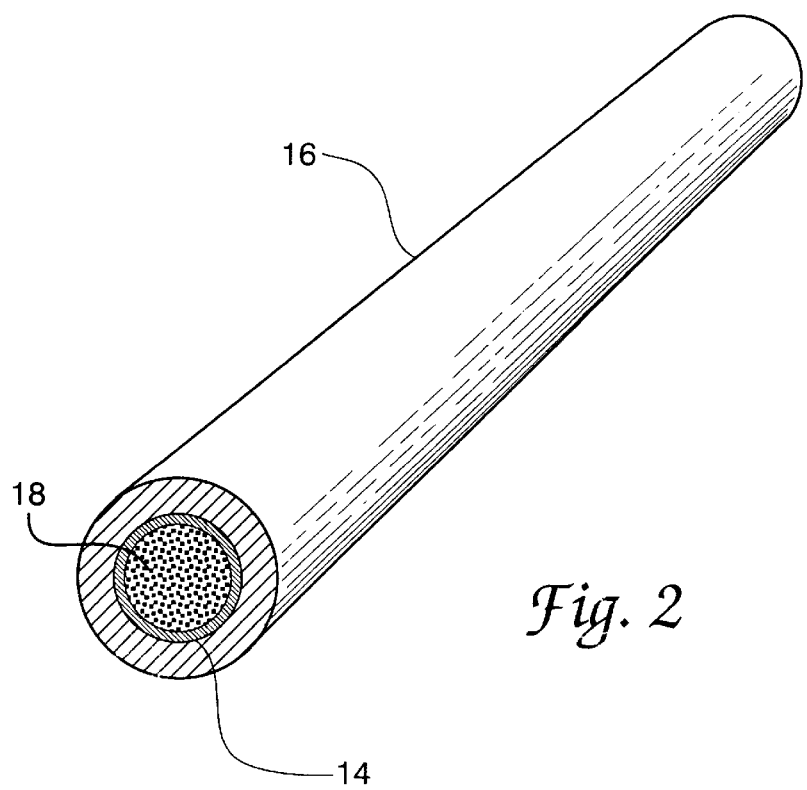
FIG. 2 is a perspective view of a powder inside a tube geometry with a diffusion barrier made of neodymium gallate according to the present invention.

FIG. 2 is a perspective view of a powder inside a tube geometry with a diffusion barrier 14 made of neodymium gallate ($NdGaO_3$ or NGO) according to the present invention. Diffusion barrier 14 is positioned between a high purity (99.98%) nickel sheath 16 surrounding a core 18 of high temperature $YBa_2Cu_3O_x$ (YBCO). During high temperature melt-processing of the YBCO core 18 at temperatures about 1050° C., diffusion barrier 14 prevents a contaminating diffusion of nickel from sheath 16 into YBCO core 14.

Applying a diffusion barrier in a controllable manner inside long, small diameter (2 mm to 20 mm inner diameter) tubes is a difficult process. A unique roll-forming method had to be developed to make the superconducting wire shown in FIG. 2.

FIG. 3 is a cross-sectional view of a flat strip 20 of solid metal, nickel in this embodiment, with a diffusion barrier layer 22 of NGO. The NGO can be applied by sputtering, ion beam mixing, plasma spraying, slip casting or slurry casting. In practice, slurry casting has thus far proved to be the most convenient. NGO powder is simply mixed with an organic solvent and painted over nickel strip 20. The NGO powder is then sintered at temperatures sufficient for nickel from nickel strip 20 to diffuse into the NGO. Temperatures sufficient for nickel to diffuse into the NGO range from about 1000° C. to about 1300° C. for various durations up to about 12 hours. Sintering binds the NGO to nickel strip 20 and fixes it so that it will not react chemically with the YBCO during the later melt-processing step.

That the NGO does not react chemically with the YBCO is surprising because the prior art has experienced chemical reactions between YBCO and NGO at temperatures of 800° C. and less. Some of the advantages of using NGO as a surface barrier for high temperature YBCO is that both YBCO and NGO have comparable thermal expansion coefficients over a broad temperature range and that there is a good match between the a-b plane of YBCO and the oxygen sublattice of NGO (a mismatch of less than 0.27%). Because of these advantages, the prior art has attempted to use NGO as a substrate for making superconducting thin films. The NGO has been applied over a primary substrate to help match the physical properties of YBCO to the primary substrate. As stated, during these attempts the prior art experienced serious chemical reactions at temperatures of 800° C. and less, well below the YBCO melt-processing temperatures of about 1,050° C. The prior art has also applied an amorphous NGO precursor film over an $LaAlO_3$ substrate and then annealed the film in an $O_2$ atmosphere for six to twelve hours from 750° C. to 1000° C. to form a crystalline, phase-pure, highly oriented NGO film on the $LaAlO_3$ substrate. The NGO film has an extremely high purity and atomically abrupt interfaces between the NGO film and its substrate. In contrast, the inventors have discovered that their step of presintering at temperatures sufficiently high to cause saturation or diffusion of the substrate material into the NGO, generally in the range of about 1000° C. to about 1300° C., prevents undesirable chemical reactions during melt-processing.

FIG. 4 is a cross-sectional view of flat strip 20 and diffusion barrier layer 22 of FIG. 3 partially roll-formed into a superconductor sheath 24. Sheath 24 is formed into a trough and YBCO ceramic powder 26 inserted inside the trough.

Finally, rolling of sheath 24 is completed to form a tube 28, as shown in cross-section in FIG. 5. A seam 30 is left open for oxygen to penetrate during the oxygen anneal procedure which occurs during melt-processing of YBCO 26. The seam may be left open after melt-processing. At the completion of melt-processing of YBCO 26, the result is a high mechanical strength (50 Ksi), high current (1,000's amperes), high current density ($>10^4$ A/cm$^2$), high magnetic field ($>=10$ Tesla), high temperature (up to 77° K), high efficiency (up to 99.9%), lightweight (0.05 kg/kw) and high energy storage density (100 kj/kg) superconducting wire.

The use of a diffusion barrier allows the mechanically strong nickel sheath 24 to act as a crucible for the demanding YBCO melt-processing. The YBCO melt-process enables grain orientation and inclusion of microscale magnetic pinning features that provide the high performance superconducting properties.

A series of experiments was performed to help describe some of the parameters of the described invention. A range of sintering temperatures from about 1000° C. to about 1300° C. was used with dwelling times up to 12 hours. An average weight percent of nickel (Ni) in the NGO surface layer was measured using the XRF technique. The presintering appears to alter the nickel content in the NGO from about 0.14 wt % at 1000° C. to about 0.93 wt % at 1300° C. This shows a saturation of Ni in the NGO surface layer. The saturation indicates that the nickel has reacted with the NGO. This reaction is necessary for the NGO to successfully bind to the nickel substrate. Without that binding, the NGO buffer layer will not work to prevent diffusion of nickel from the nickel substrate into a YBCO superconductor during later melt-processing. There can be no reaction, and thus no binding, below temperatures of about 1000° C. because the melting point of nickel is about 1400° C. and the sintering must be performed at a temperature sufficiently close to the melting temperature of nickel for a reaction to take place. The melting point of NGO is about 1280 20 C. and establishes an upper limit for a successful reaction and binding to take place. YBCO was melt-processed on top of the NGO surface layer in a tube furnace with a cooling rate of 2° C./hr between 1040° C. and 980° C. A transition from the normal to a superconducting state was observed at a critical temperature ($T_C$) of about 91° K with an excellent connectivity between grains. When the same melt-processing heat treatment was performed with a pellet of YBCO on a nickel substrate without the NGO surface layer, a significant drop in the critical temperature and weak-link behavior of grain boundaries were observed due to diffusion of Ni and Ga into the melt-processed superconducting material.

Those with skill in the art will readily see that the present invention may be extended to include applying an NGO surface layer to nickel substrates that are not only the inside surface of tubes as described, but also the outer surfaces of tapes, wires and plates, or any surface shape for a substrate which may prove useful in the future as part of a superconducting device.

Experience has shown the preferred range of sintering temperatures for practicing the invention to be between about 1100° C. and about 1300° C. Sintering at lower temperatures should be done for longer holding periods.

The disclosed new method for making a neodymium gallate surface layer on a nickel substrate successfully demonstrates the value of higher sintering temperatures for making a nickel diffusion barrier that will not react chemically with melt-processed YBCO superconducting material. Although the disclosed method and manufacture are specialized, their teachings will find application in other areas where promising materials, which now appear to be unusable, may yet work as hoped by experimenting with operating conditions beyond those considered appropriate by the prior art.

It is understood that various modifications to the invention as described may be made, as might occur to one with skill in the field of the invention, within the scope of the claims. Therefore, all embodiments contemplated have not been shown in complete detail. Other embodiments may be developed without departing from the spirit of the invention or from the scope of the claims.

We claim:

1. A ceramic superconductor, comprising:
    (a) a nickel substrate;
    (b) a yttrium-based copper oxide superconductor; and,
    (c) between the nickel substrate and the yttrium-based copper oxide superconductor, a diffusion barrier made of neodymium gallate, wherein the neodymium gallate has been presintered on the nickel substrate at temperatures sufficient for nickel from the nickel substrate to diffuse into the neodymium gallate.

2. The ceramic superconductor according to claim 1, wherein the nickel substrate is a tube.

3. The ceramic superconductor according to claim 1, wherein the nickel substrate is a flat tape.

4. The ceramic superconductor according to claim 1, wherein the nickel substrate is a wire.

5. The ceramic superconductor according to claim 1, wherein the nickel substrate is a plate.

6. A substrate for a ceramic superconductor, comprising:
    (a) a nickel layer; and,
    (b) a layer of neodymium gallate over the nickel layer, wherein the neodymium gallate has been presintered on the nickel layer at temperatures sufficient for nickel from the nickel layer to diffuse into the neodymium gallate.

7. A ceramic superconductor, comprising:
    (a) a nickel substrate, comprising a first layer of nickel, a second layer of neodymium gallate with nickel diffused inside the second layer, and, over the second layer, a third layer of neodymium gallate; and,
    (b) over the third layer of the nickel substrate, a layer of yttrium-based copper oxide superconductor.

8. A substrate for a ceramic superconductor, comprising:
    (a) a first layer of nickel layer;
    (b) a second layer of neodymium gallate with nickel diffused inside the second layer; and,
    (c) over the second layer, a third layer of neodymium gallate.

* * * * *